United States Patent
Basol et al.

(10) Patent No.: US 6,852,630 B2
(45) Date of Patent: Feb. 8, 2005

(54) ELECTROETCHING PROCESS AND SYSTEM

(75) Inventors: Bulent M. Basol, Manhattan Beach, CA (US); Cyprian Uzoh, Milpitas, CA (US); Halit N. Yakupoglu, Corona, CA (US); Homayoun Talieh, San Jose, CA (US)

(73) Assignee: ASM Nutool, Inc., Milpitas, CA (US)

( * ) Notice: Subject to any disclaimer, the term of this patent is extended or adjusted under 35 U.S.C. 154(b) by 314 days.

(21) Appl. No.: 09/841,622

(22) Filed: Apr. 23, 2001

(65) Prior Publication Data

US 2002/0153097 A1 Oct. 24, 2002

(51) Int. Cl.[7] .............................................. H01L 21/302
(52) U.S. Cl. ....................... 438/691; 438/692; 438/694; 438/745; 438/747
(58) Field of Search ................................ 438/691, 692, 438/694, 745, 747

(56) References Cited

U.S. PATENT DOCUMENTS

| | | | |
|---|---|---|---|
| 6,103,096 A | * | 8/2000 | Datta et al. ................. 205/686 |
| 6,176,992 B1 | | 1/2001 | Talieh |
| 6,251,238 B1 | | 6/2001 | Kaufman et al. |
| 6,261,426 B1 | * | 7/2001 | Uzoh et al. ............. 204/224 R |
| 2002/0108861 A1 | * | 8/2002 | Emesh et al. ................. 205/81 |

* cited by examiner

Primary Examiner—Nadine G. Norton
Assistant Examiner—Binh X. Tran
(74) Attorney, Agent, or Firm—Knobbe, Martens, Olson & Bear LLP.

(57) ABSTRACT

A system for optionally depositing or etching a layer of a wafer includes mask plate opposed to the wafer with the mask plate having a plurality of openings that transport a solution to the wafer. An electrode assembly has a first electrode member and a second electrode member having channels that operatively interface a peripheral and center part of the wafer. The channels transport the solution to the mask.

23 Claims, 5 Drawing Sheets

ELECTROETCHING PROCESS AND SYSTEM

FIELD OF THE INVENTION

The present invention generally relates to electroetching process technology and, more particularly, to an electroetching process and apparatus to yield planar deposition layers.

BACKGROUND OF THE INVENTION

Conventional semiconductor devices generally include a semiconductor substrate, usually a silicon substrate, and a plurality of sequentially formed dielectric interlayers such as silicon dioxide and conductive paths or interconnects made of conductive materials. The interconnects are usually formed by filling a conductive material in trenches etched into the dielectric interlayers. In an integrated circuit, multiple levels of interconnect networks laterally extend with respect to the substrate surface. The interconnects formed in different layers can be electrically connected using vias or contacts. A conductive material filling process of such features, i.e., via openings, trenches, pads or contacts, can be carried out by depositing a conductive material over the substrate including such features.

FIGS. 1A-1E exemplify a conventional electrodeposition method and apparatus. FIG. 1A illustrates a substrate 10 having an insulator layer 12 formed thereon. Using conventional etching techniques, features such as a row of small vias 14 and a wide trench 16 are formed on the insulator layer 12 and on the exposed regions of the substrate 10. Typically, the widths of the vias 14 may range from a few microns to sub-micron. The trench 16 shown in this example, on the other hand, is wide and has a small aspect ratio. In other words, the width of the trench 16 may be five to fifty times or more greater than its depth. In other applications, the width of the trenches may be comparable or even smaller than its depth.

FIGS. 1B-1C illustrate a conventional method for filling the features with copper material. FIG. 1B illustrates that a barrier/glue 18 or adhesion layer and a seed layer 20 are sequentially deposited on the substrate 10 and the insulator 12. In FIG. 1C, after depositing the seed layer 20, a conductive material layer 22 (e.g., copper layer) is partially electrodeposited thereon from a suitable plating bath or bath formulation. During this step, an electrical contact is made to the copper seed layer 20 and/or the barrier layer 18 so that a cathodic (negative) voltage can be applied thereto with respect to an anode (not shown). Thereafter, the copper material layer 22 is electrodeposited over the substrate surface using specially formulated plating solutions.

As shown in FIG. 1C, the copper material 22 completely fills the via 14 and is generally conformal in the large trench 16, because the additives that are used are not operative in large features. The Cu thickness t1 at the bottom surface of the trench 16 is about the same as the Cu thickness t2 over the insulator layer 12. As can be expected, to completely fill the trench 16 with the Cu material, further plating is required. FIG. 1D illustrates the resulting structure after additional Cu plating. In this case, the Cu thickness t3 over the insulator layer 12 is relatively large and there is a step s1 from the top of the Cu layer on the insulator layer 12 to the top of the Cu layer 22 in the trench 16. For IC applications, the Cu layer 22 needs to be subjected to CMP or other material removal process so that the Cu layer 22 as well as the barrier layer 18 on the insulator layer 12 are removed, thereby leaving the Cu layer only within the features 14 and 16. These removal processes are known to be quite costly. Methods and apparatus to achieve a generally planar Cu deposit as illustrated in FIG. 1E would be invaluable in terms of process efficiency and cost. The Cu thickness t5 over the insulator layer 12 in this example is smaller than the conventional case as shown in FIG. 1D, and the step height s2 is also much smaller. Thin copper layer in FIG. 1E may be removed by electro polishing, CMP or other methods.

The importance of overcoming the various deficiencies of the conventional electrodeposition techniques is evidenced by technological developments directed to the deposition of planar copper layers. For example, U.S. Pat. No. 6,176,992 to Talieh, entitled "Method and Apparatus for Electrochemical Mechanical Deposition" and commonly owned by the assignee of the present invention, describes in one aspect an electro chemical mechanical deposition technique (ECMD) that achieves deposition of the conductive material into the cavities on the substrate surface while minimizing deposition on the field regions by polishing the field regions with a pad as the conductive material is deposited, thus yielding planar copper deposits.

U.S. application Ser. No. 09/740,701 entitled "Plating Method and Apparatus that Creates a Differential Between Additive Disposed on a Top Surface and a Cavity Surface of a Workpiece Using an External Influence," also assigned to the same assignee as the present invention, describes in one aspect a method and apparatus for plating a conductive material onto the substrate by creating an external influence, such as causing relative movement between a workpiece and a mask, to cause a differential in additives to exist for a period of time between a top surface and a cavity surface of a workpiece. While the differential is maintained, power is applied between an anode and the substrate to cause greater relative plating of the cavity surface than the top surface and therefore a planar deposit is obtained.

U.S. application Ser. No. 09/735,546 entitled "Method and Apparatus For Making Electrical Contact To Wafer Surface for Full-Face Electroplating or Electropolishing," filed on Dec. 14, 2000 describes in one aspect a technique for providing full face electroplating or electropolishing. And U.S. application Ser. No. 09/760,757 entitled "Method and Apparatus for Electrodeposition of Uniform Film with Minimal Edge Exclusion on Substrate," filed on Jan. 17, 2001 describes in one aspect a technique for forming a flat conductive layer on a semiconductor wafer surface without losing space on the surface for electrical contacts.

As mentioned above, after depositing copper into the features on the semiconductor wafer surface, an etching, an electro polishing or a chemical mechanical polishing (CMP) step may be employed. However, in such processes there are problems in removing conductive materials off the wafer surface uniformly and in a controllable manner. These processes planarize the resulting surface and remove the conductive materials off the field regions of the surface, thereby leaving the conductive materials only within the via and trench features of interest. In the electro dissolution process, which includes electrochemical etchings or "electroetching" and electropolishing both the material to be removed and a conductive electrode are dipped into a suitable electrolyte solution. Typically an anodic (positive) voltage is applied to the material with respect to the conductive electrode. With the applied voltage, the material is electrochemically dissolved and removed from the wafer surface.

To this end, in the semiconductor IC industry, there is a need for processes and apparatus that can remove materials in a uniform and controllable manner.

SUMMARY OF THE INVENTION

In one aspect of the present invention, a system for etching a wafer having a conductive front surface comprises a cathode assembly having at least two cathode members, wherein each cathode member has the ability to receive its own power; and a first etching solution contacting the at least two cathode members, wherein the cathode members are electrically isolated from one another.

In another aspect of the present invention, a system for optionally depositing or removing a layer of a wafer comprises a mask plate opposed to the wafer; the mask plate having a plurality of openings that transport a solution to the wafer; an electrode assembly having a first electrode member and a second electrode member; the first electrode member having a plurality of first channels that operatively interface a first part of the wafer; the first channels transport the solution to the mask; the second electrode member having a plurality of second channels that operatively interface a second part of the wafer; and the second channels transport the solution to said mask.

In yet another aspect of the present invention, a process for partially removing a conductive front surface of a semiconductor wafer having a conductive front surface comprises (a) positioning the conductive front surface above a cathode assembly which comprises multiple cathode members; (b) providing an etch solution that wets the cathode members and the conductive front surface; (c) connecting the multiple cathode members to multiple power sources, wherein the multiple cathode members are substantially electrically isolated from one another; (d) applying power to the cathode members from the multiple power sources; (e) positioning a mask plate between the cathode assembly and the conductive front surface of the wafer; and (e flowing the etch solution through the mask plate so that the etch solution wets the conductive front surface.

These and other features, aspects and advantages of the present invention will become better understood with reference to the following drawings, description and claims.

DETAILED DESCRIPTION OF THE PREFERRED EMBODIMENT

As will be described below, the present invention provides a method and a system to selectively electrochemically remove a conductive material layer deposited on a surface of a semiconductor. The invention can be used with ECMD, other plating systems that yield planar deposits, as well as other plating systems that deposit conformal films. In general, when a conductive surface of substrate or work piece is electroetched or electropolished some regions on the conductive surface may be etched faster than the other regions of the conductive surface. For example, during an electroetching process of a surface of a wafer, the current density applied to the surface is substantially greater at the periphery of the surface than the center of the surface. In the prior art, this higher current density results in an increased etching rate of the deposited film at the periphery of the wafer as compared to the wafer center. With the present invention, the etching difference between the interior and the periphery of the wafer may be eliminated with use of the combination of the perforated plate or a mask and a multiple cathode assembly of the present invention. The combination of the perforated plate and the cathode assembly facilitates uniform etching of the conductive material. Further, in another embodiment, the present invention achieves etching of the conductive material through the combination of the use of the cathode assembly and by contacting, sweeping and/or polishing of the conductive surface with the perforated plate of the present invention.

Figure 1A:
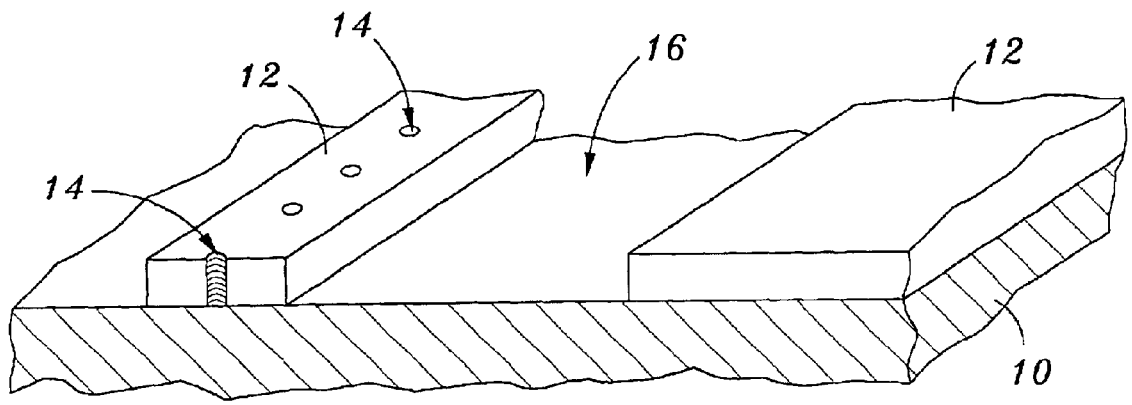
FIGS. 1A to 1E schematically depict a conventional process of electrodeposition of a semiconductor device.
Figure 1B:
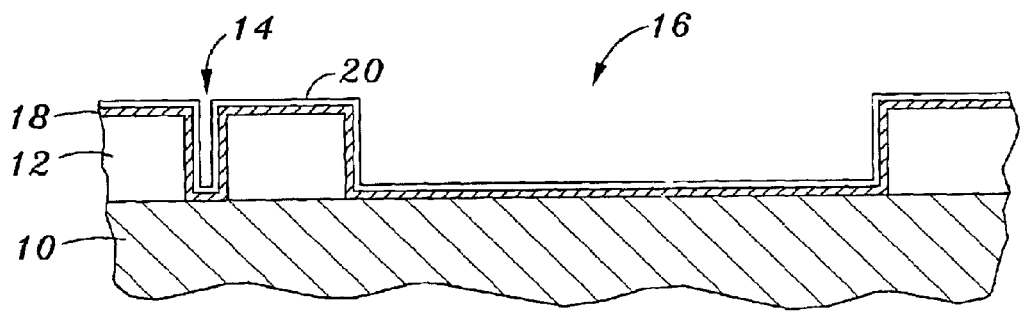
Figure 1C:
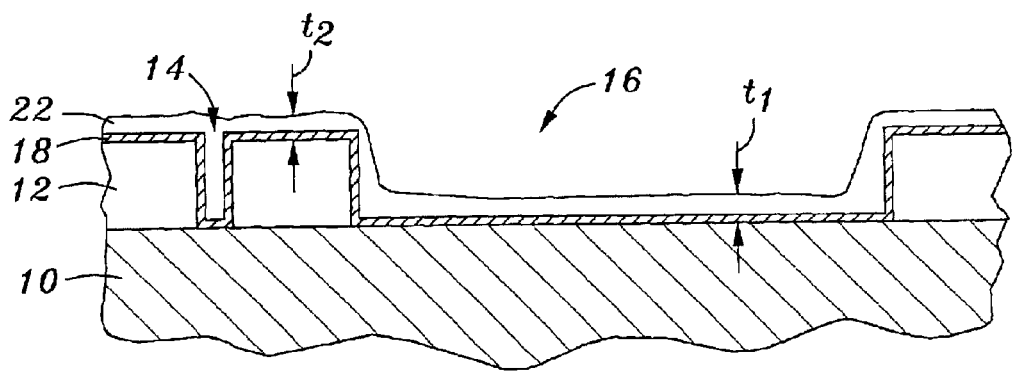
Figure 1D:
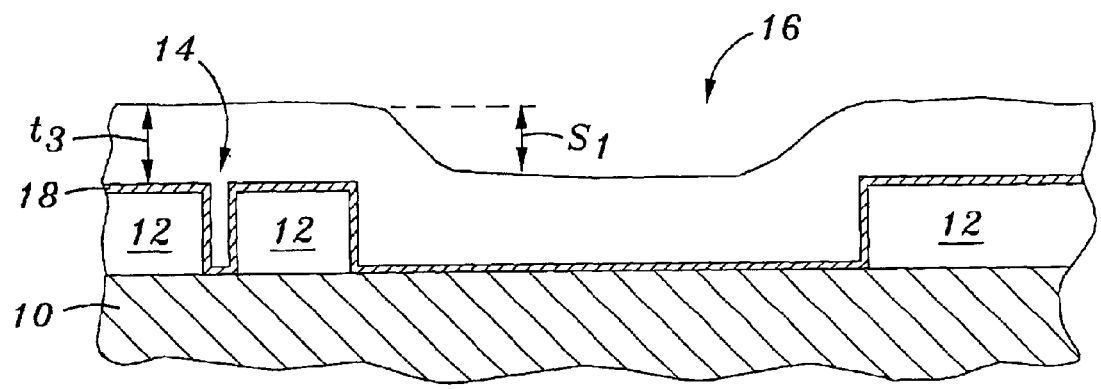
Figure 1E:
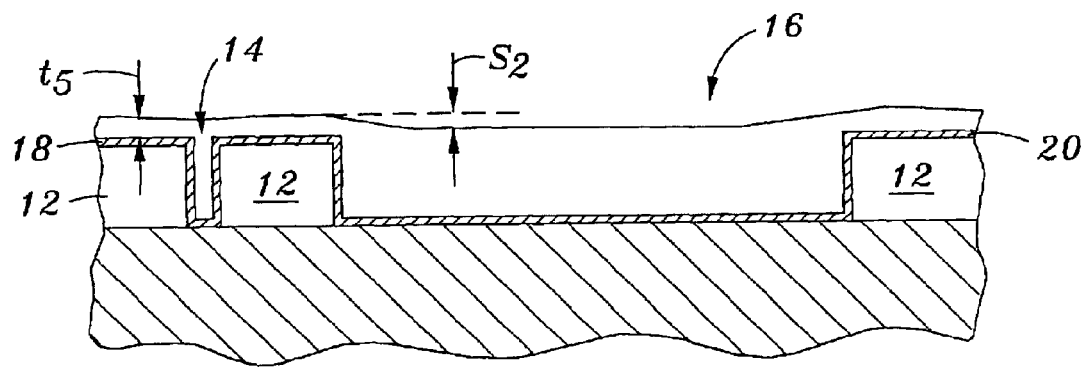
Figure 2:
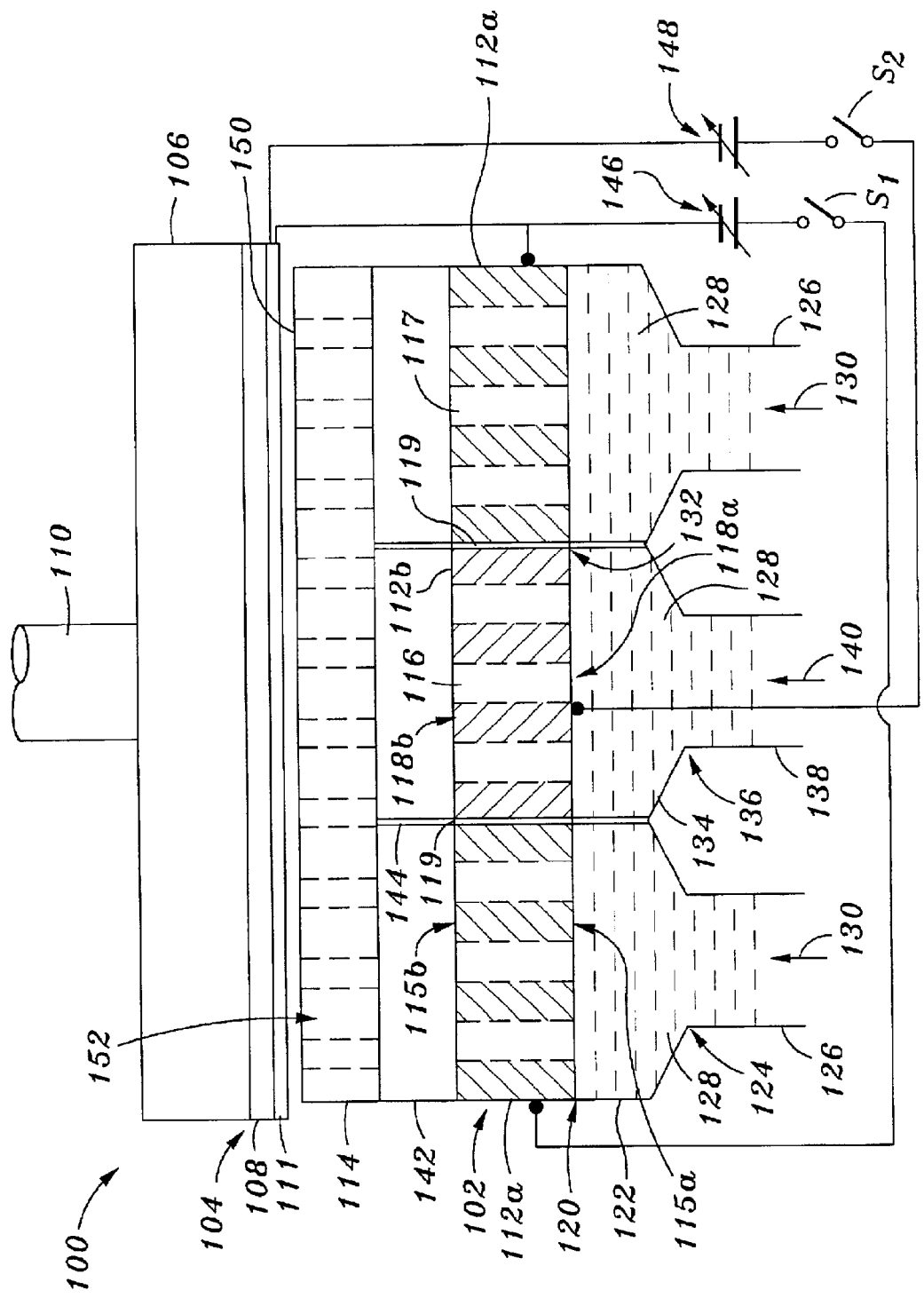
FIG. 2 is a schematic plan side view of an electrochemical etching system according to an embodiment of the present invention.
Figure 3:
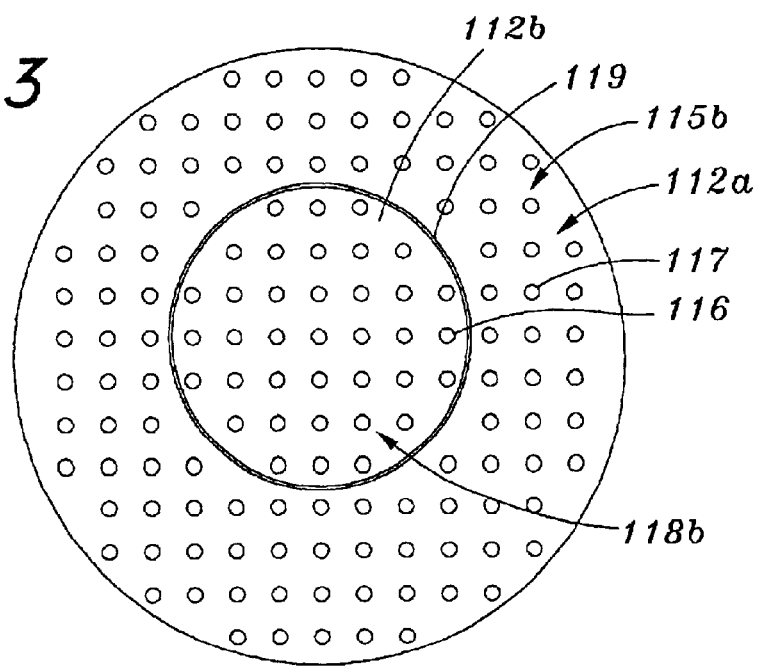
FIG. 3 is a schematic plan top view of an electrode assembly according to an embodiment of the present invention.

Reference will now be made to the drawings wherein like numerals refer to like parts throughout. As shown in FIGS. 2 and 3, an electrochemical etching system 100 of the present invention may preferably comprise a first, or cathode, subsystem 102 and a second, or anode, subsystem 104. The system 100 is used to remove or partially remove a conductive material such as copper deposited on a semiconductor wafer such as a silicon wafer or semiconductor package, thin film, etc. Although copper is used as an example, the present invention may be used for etching other common conductors such as Ni, Pd. Pt, Sn, Ag, Au and their alloys. The anode subsystem 104 of the etching system 100 may be comprised of a wafer carrier 106, shown in FIG. 2, holding an exemplary wafer 108. The wafer 108 forms the anode, in this embodiment, of the etching system 100 and is already plated with copper and, therefore, comprises a copper layer 111 formed thereon. The carrier arm 110 is adapted to rotate or move the wafer carrier 106 laterally or vertically.

The cathode subsystem 102 of the system 100 may be comprised of an electrode assembly 112 (e.g., cathode assembly in this embodiment), and a mask plate 114. The cathode assembly 112 may preferably have a circular shape and comprise a circular first electrode or cathode member 112a and a circular second electrode or cathode member 112b. However, the present invention contemplates that the shapes of the first and second electrode members may not only be the same but also different. The first cathode member 112a comprises a bottom surface 115a and a top surface 115b. A plurality of first channels 117 extends between the bottom and top surfaces 115a and 115b.

As can also be seen in FIG. 3, the first cathode member 112a is concentrically placed around the second cathode member 112b. The second cathode member 112b also comprises a plurality of second channels 116 extending from a bottom surface 118a to a top surface 118b of the second cathode member 112b. Although in this embodiment the size and shape and density of the channels 116 and 117 are alike in both cathode members 112a, 112b, depending on the application, the channels 116 and 117 may have varying dimensions and shapes. The first cathode member 112a and the second cathode member 112b are substantially electrically isolated from one another, preferably by an isolating wall 119 made of electrical isolators. A first end 120 of a first cathode cup 122 is sealably connected to the first cathode member 112a while a second end 124 is connected to a first supply section 126. The supply section 126 connects the first cathode cup 122 to an etching solution supply or storage tank (not shown). The first cathode member 112a receives an etching solution 128 through the first cathode cup 122 in the direction of the arrow 130. The etching or polishing solution 128 may be an acidic, alkaline or even neutral solution. Similarly, a first end 132 of a second cathode cup 134 is sealably connected to the second cathode member 112b while a second end 136 is connected to a second supply section 138 to receive the etching solution 128 in the direction of arrow 140. The supply section 138 connects the second cathode cup 134 to an etching solution supply or storage tank (not shown). The cathode members 112a, 112b may be made of inert materials that are not etched or react with the etching solutions or electrolytes used during the process. Such inert materials may be titanium, platinum, platinum coated titanium or the like.

In this embodiment, if the cathode members 112a, 112b receive the etching solution from the same storage tank, etching solution flow rate may be in the range of 1 to 15 liters per minute for the total upper surface area of the cathode members 112a, 112b. Further, in this embodiment it is possible to use a first etching solution tank to feed the first cathode member 112a and a second etching solution tank to feed the second cathode member 112b. In such case, etching solution flow rate may be calculated based on the upper surface areas of each cathode member 112a, 112b. In both approaches, however, etching solution flow rates for the first and second cathode members 112a, 112b may be varied to increase or decrease the etching rate on the corresponding surface region of the wafer. A higher etching solution flow rate results in a higher etching rate on the etched region of the wafer. If the above mentioned first and second etching solution storage tanks are used, each tank may be used to store etching solutions having different etching abilities, i.e., a weak acid, or a first solution, in the first storage tank and a slightly strong acid, or a second solution, in the second storage tank. A first solution may be a weak sulfuric acid and the second solution may be a slightly strong sulfuric acid. By varying the strength of the etching solutions to different regions of the wafer, etch rate may also be varied on these regions.

As best seen in FIGS. 2 and 3, the first and second cathode members 112a and 112b, and specifically their respective channels, operatively interface selected parts of the wafer 108, namely, a first or peripheral part and a second or center part. Thereby, the etching solution 128 may be directed, via the first and second cathode members 112a and 112b, to the selected parts of the wafer 108, as further described below.

The mask plate 114 may be placed on extended sealing wall sections 142 and 144 formed around the periphery of the cathode members 112a and 112b respectively. In accordance with the principles of the present invention, the first cathode member 112a is electrically connected to a negative terminal of a first power supply 146 or source, and the wafer 108 to be etched is electrically connected to the positive terminal of the first power supply 146. Similarly, the second cathode member 112b may be electrically connected to a negative terminal of a second power supply 148 and the wafer 108 is also electrically connected to the positive terminal of the second power supply 148. Alternatively, the system 100 may use a single power supply which employs a switching system that has the capability of applying power to either cathode members 112a, 112b or any other system that gives each cathode member the ability to receive its own power.

The mask plate 114 may comprise a plurality of openings 150 or asperities which allow an etching solution 128 to flow through the mask 114 and wet the front surface 111 of the wafer 108 and etch material from the front surface 111 under the applied potential between the wafer and cathode members 112a, 112b. During the electroetching process the wafer surface 111 may be kept substantially parallel to an upper surface 152 of the mask plate 114 and rotated.

It is noted that the above description describes rotation and movement of the wafer 108, assuming that the plate 114 was stationary. It is understood that the system 100, as described above, will allow for either the wafer or the plate to move, or for both of them to move, thereby creating the same relative affect. This motion, as an example, can be a rotational motion or a rotation motion with linear translation. For ease of description, however, the invention was above-described and will continue to be described in terms of movement of the wafer.

As will be described below, with the applied power from the first power supply 146 and in combination with the functionalities of the mask asperities, the first cathode member 112a may, for example, control the material removal at the periphery of the of the front surface 111 of the wafer 108. In this respect, power from the second power supply 148 allows second cathode member 112b to separately (and/or sequentially as mentioned below) control the thickness on the center or near center regions of the front surface 111. During the etching process, the etching solution 128 is pumped into the cathode cups 122, 134 so as to reach and wet the surface 111 of the wafer 108 which is rotated. The mask plate 114 and the cathode cups 122, 134 may have bleeding openings (not shown) to control the flow of solution.

In typical usage, the power from the power supplies 148 and 146 are adjusted so that initially the middle section of the wafer is etched and then etching is completed around the periphery. This is preferred because if the edge film is initially etched away, ohmic contacts made to that region may deteriorate.

A planar electroetching process can also be employed. In this case, the anode subsystem 102 may be lowered toward the cathode subsystem 104 and the front surface 111 of the wafer 108 is contacted with the upper surface 152 of the mask 114 while the wafer 108 is rotated. In this embodiment, the mask 114 may be made of a rigid material such as a hard dielectric material, or optionally the upper surface 152 of the mask 114 may contain rigid abrasive materials. During this process, addition of mechanical polishing or sweeping provides substantially planar removal of the layer of the wafer. In the above or the following embodiment, the etching process depends on the strength of the etching solution, used voltages, etching solution flow rates, density and the shape of the asperities in the cathode members as well as in the mask plate.

Figure 4A:
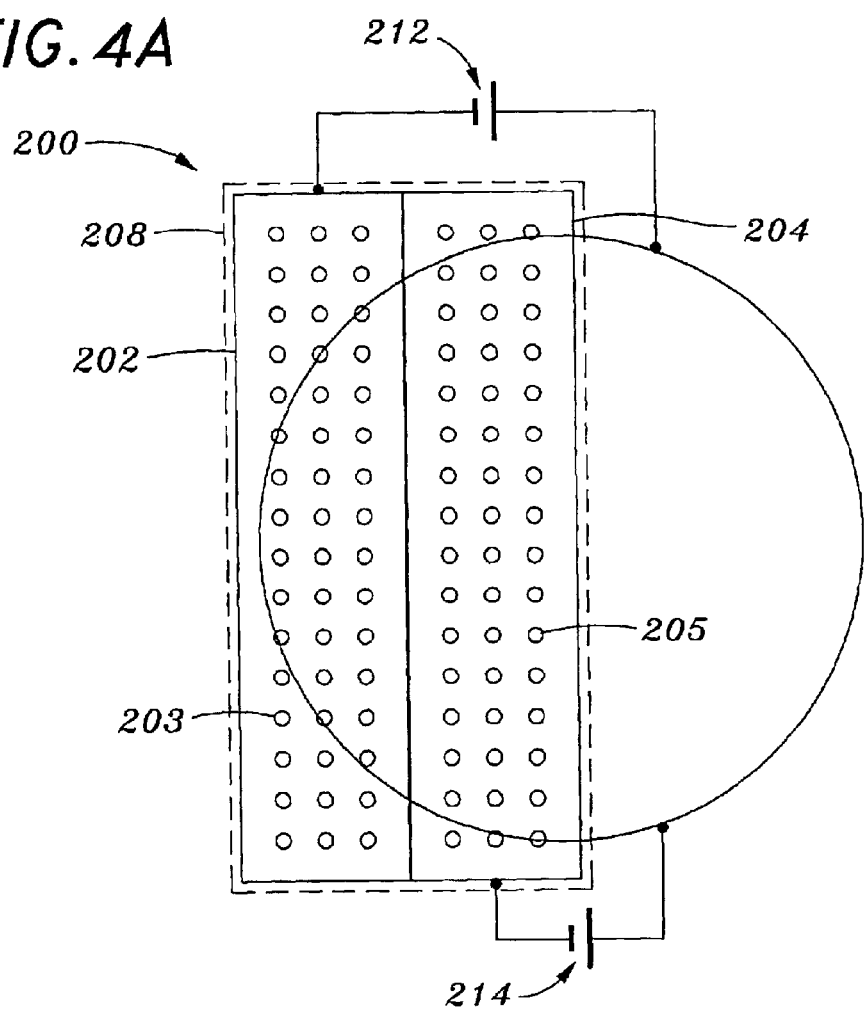
FIG. 4A is a schematic plan top view of an electrode assembly according to another embodiment of the present invention.
Figure 4B:
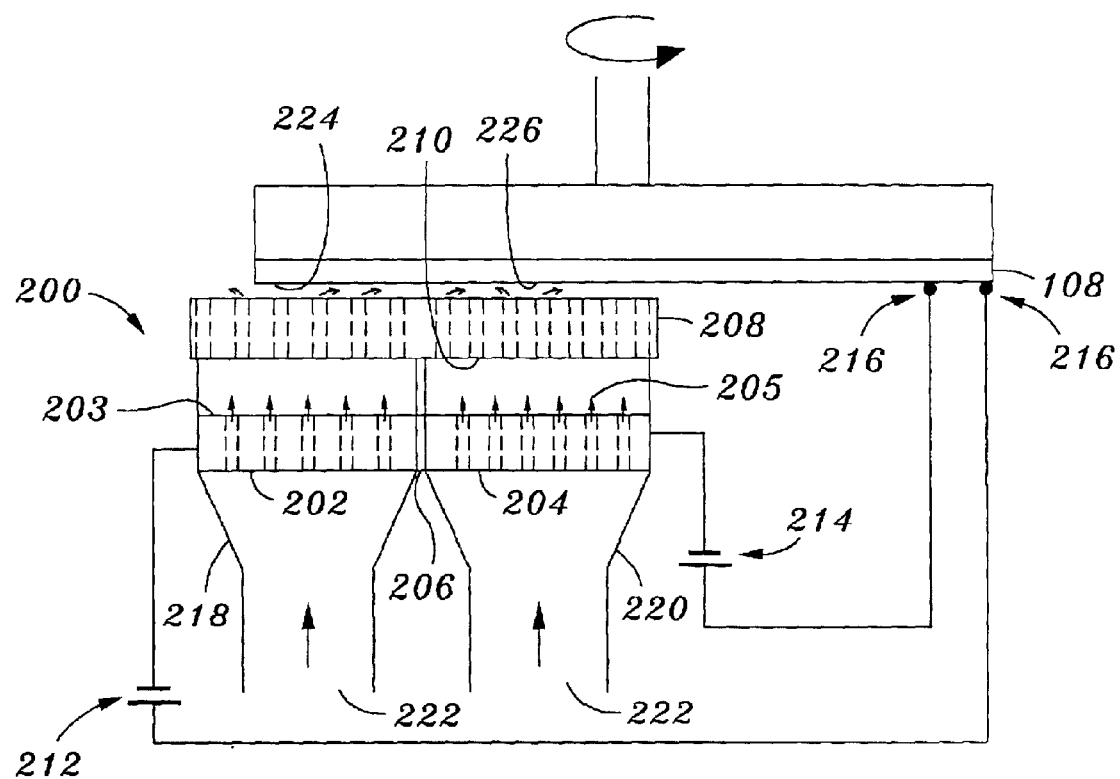
FIG. 4B is a schematic plan side view of an electrochemical etching system that can employ the electrode assembly of FIG. 4A according to an embodiment of the present invention.

FIGS. 4A-4B show another embodiment of a cathode subsytem 200 which comprises a first cathode member 202 with openings 203 and a second cathode member 204 with openings 205. The first and the second cathode members 202 and 204 are side-by-side but isolated from one another by an isolation member 206. Both the first and the second members 202 and 204 are strip or rectangular shaped and may be used with a mask 208 having openings 210, which may have a rectangular shape covering both cathode members 202, 204. In this embodiment, the first cathode member 202 is electrically connected to a negative terminal of a first power supply 212 while the second cathode member 204 is connected to a negative terminal of a second power supply 214. Contact members 216 moveably connect the front surface of the wafer 108 to positive terminals of the power supplies 212 and 214. During the etching contact members 216 slide over the front surface of the wafer 108. As in the previous embodiment, a first cathode cup 218 and a second cathode cup 220 allow etching solution 222 to flow towards the cathode members 202 and 204. The etching solution flows through the cathode members 202, 204 and the mask 208 and reaches the portion of the wafer above the mask 208. As the wafer 108 is rotated, the full front surface of the wafer 108 is wetted and etched by the etching solution 222 flowing through the mask 208. Accordingly, the first cathode member 202 controls the etching rate at an outer region 224 of the wafer 108, i.e., edge of the wafer 108, which rotates during the electroetching process. Similarly, the second cathode member 204 controls the etching rate at inner region 226 of the wafer 108, i.e., the center of the wafer 108.

It is also within the scope of the present invention that the systems 100 and 200 described above may be used to electrodeposit planar conductor layers by reversing the polarity and replacing the etching solution with an electrolyte solution to deposit copper on the conductive surface of the wafer. In this case, by reversing the polarity, the conductive surface of the wafer or the wafer itself becomes a cathode and the cathode members become anode members. Such multiplicity of anodes can be used to deposit planar layers in controlled manner. For example, by applying different voltages to an anode member controlling the deposition to the edge of the wafer and another anode member controlling the deposition to the rest of the wafer, i.e., center surrounded by the edge of the wafer, planar deposition layers on the entire front surface of the wafer can be obtained.

It is to be understood that the foregoing discussion and appended claims, the terms "etching", "electroetching", "electrochemical etching", "polishing" and "electropolishing" include, but not limited to, the material removal process of the present invention.

It should be understood, of course, that the foregoing relates to preferred embodiments of the invention and that modifications may be made without departing from the spirit and scope of the invention as set forth in the following claims.

We claim:

1. A process for partially removing a conductive front surface of a semiconductor wafer having a conductive front surface, the process comprising the steps of:
   (a) positioning the conductive front surface above a cathode assembly which comprises multiple cathode members;
   (b) providing an etch solution that wets said cathode members and said conductive front surface;
   (c) connecting said multiple cathode members to multiple power sources, wherein said multiple cathode members are substantially electrically isolated from one another;
   (d) applying power to said cathode members from said multiple power sources;
   (e) positioning a mask plate between said cathode assembly and said conductive front surface of said wafer; and
   (f) flowing said etch solution through said mask plate so that said etch solution wets said conductive front surface.

2. The process of claim 1, further comprising (g) controlling the etching at selected parts of said conductive front surface.

3. The process of claim 2, wherein step (g) comprises directing, through said cathode members, said etch solution at said selected parts of the conductive front surface.

4. The process of claim 3, wherein step (g) further comprises directing said etch solution to a peripheral part of said conductive front surface separately from directing said etch solution to a center part of the conductive front surface.

5. The process of claim 4, wherein step (g) further comprises operatively interfacing selected cathode members with said selected parts of the conductive front surface.

6. A process for electrochemically removing or depositing a layer of a semiconductor wafer, the process comprising the steps of:
   (a) flowing a solution through an electrode assembly which comprises a first electrode member and a second electrode member;
   (b) transporting said solution from said electrode assembly to a mask plate that interfaces said wafer;
   (c) wetting selected parts of said wafer with said solution, wherein said selected parts cmprise a peripheral part and a center part; and
   (d) applying a current to said selected parts of said wafer, wherein step (c) further comprises etching said center part prior to etching said peripheral part.

7. The process of claim 6, wherein step (c) further comprises sequentially providing said current to said first and second electrode members.

8. An electropolishing method for removing material from a conductive surface of a wafer using a cathode assembly comprising at least two cathodes and a surface, and an electropolishing solution that wets the cathode assembly and the conductive surface, the method comprising:
   positioning the conductive surface near the surface of the cathode assembly;
   supplying power to each cathode wherein each cathode is adapted to receive different power; and
   mechanically sweeping the surface of the wafer with a mask plate while maintaining a relative motion between the mask plate and the surface.

9. The electropolishing method of claim 8, further comprising the step of flowing the electropolishing solution through openings in the mask plate.

10. The electropolishing method of claim 8, wherein the relative motion comprises rotating the wafer so that the rest of the conductive surface comes near the surface of the cathode assembly.

11. The electropolishing method of claim 8, wherein each cathode is adapted to remove material from the conductive surface at different rates.

12. The electropolishing method of claim 8, wherein removal rate between a center portion and an edge portion of the conductive surface is substantially equal.

13. The electropolishing method of claim 8, further comprising the step of flowing the electropolishing solution through openings in each cathode.

14. The electropolishing method of claim 13, wherein each cathode is adapted to flow electropolishing solution at a different electropolishing solution flow rate.

15. The electropolishing method of claim 13, wherein each cathode is adapted to flow electropolishing solution having different acidity.

16. The electropolishing method of claim 8, wherein a portion of the conductive surface is positioned near the surface of the cathode assembly.

17. The electropolishing method of claim 16, further comprising the step of flowing the electropolishing solution through openings in the mask plate.

18. The electropolishing method of claim 16, wherein the relative motion comprises rotating the wafer so that the rest of the conductive surface comes near the surface of the cathode assembly.

19. The electropolishing method of claim 16, wherein each cathode is adapted to remove material from the conductive surface at a different rate.

20. The electropolishing method of claim 16, wherein removal rate between a center portion and an edge portion of the conductive surface is substantially equal.

21. The electropolishing method of claim 16, further comprising the step of flowing the electropolishing solution through openings in each cathode.

22. The electropolishing method of claim 21, wherein each cathode is adapted to flow electropolishing solution at a different electropolishing solution flow rate.

23. The electropolishing method of claim 21, wherein each cathode is adapted to flow electropolishing solution having different acidity.

* * * * *